United States Patent [19]

Hansen et al.

[11] Patent Number: 4,547,679
[45] Date of Patent: Oct. 15, 1985

[54] GENERATOR FOR PRODUCING HIGH-VOLTAGE RECTANGULAR PULSES

[75] Inventors: Diethard Hansen; Martin Wilhelm, both of Berlin, Fed. Rep. of Germany

[73] Assignee: Hahn-Meitner-Institut für Kernforschung Berlin GmbH, Berlin, Fed. Rep. of Germany

[21] Appl. No.: 483,348

[22] Filed: Apr. 8, 1983

[30] Foreign Application Priority Data

Apr. 26, 1982 [DE] Fed. Rep. of Germany ....... 3216285

[51] Int. Cl.⁴ .......................................... H03K 3/537
[52] U.S. Cl. ................................. 307/108; 307/106; 315/39
[58] Field of Search ................. 307/106, 108, 109; 315/39

[56] References Cited

U.S. PATENT DOCUMENTS 3,479,555 11/1969 Garwin ............................. 315/39
3,484,619 12/1969 Proud, Jr. ......................... 307/106
3,748,528 7/1973 Cronson ........................ 307/106 X
4,430,577 2/1984 Bouquet ............................ 307/108

FOREIGN PATENT DOCUMENTS 1763559 10/1971 Fed. Rep. of Germany .
2013548 10/1971 Fed. Rep. of Germany ...... 307/106
2118938 4/1972 Fed. Rep. of Germany .

OTHER PUBLICATIONS

IBM Technical Disclosure, vol. 11, No. 6, 12-1968, "Pulse Generator", by Stuckert.

Primary Examiner—A. D. Pellinen
Assistant Examiner—Derek S. Jennings
Attorney, Agent, or Firm—John C. Smith, Jr.

[57] ABSTRACT

A generator for producing high-voltage rectangular pulses is provided which comprises devices for conversion of input power supplied from a DC source into pulses of output power using capacitive storage units, a pulser head for the connection of a coaxial cable leading to a load and a gas-filled pulser tube.

17 Claims, 7 Drawing Figures

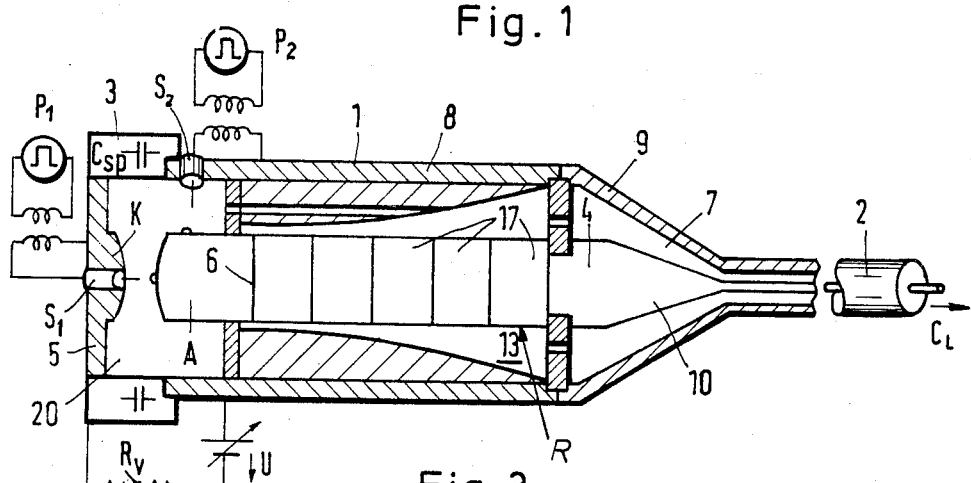
Fig. 1
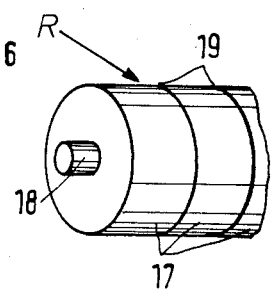
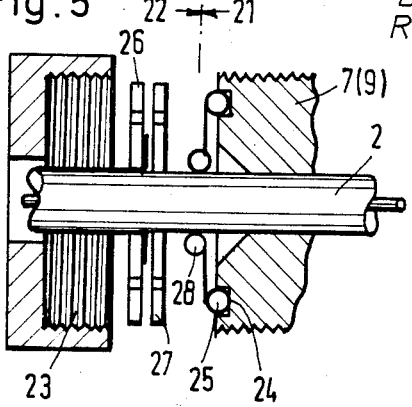
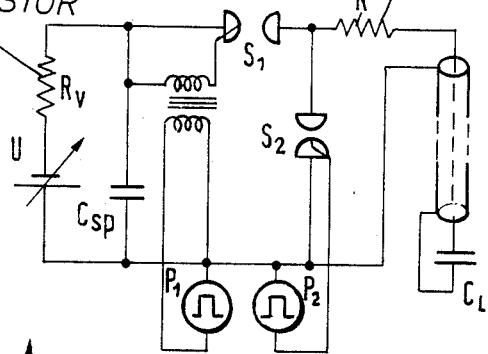
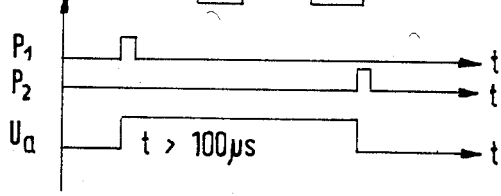

GENERATOR FOR PRODUCING HIGH-VOLTAGE RECTANGULAR PULSES

BACKGROUND OF THE INVENTION

This invention relates to a generator for producing high-voltage rectangular pulses with devices for conversion of input power supplied from a DC source into pulses of output power using capacitive storage units and with a pulser head for the connection of a coaxial cable leading to a load (capacitor, antenna, electro-optical switch, electrostatic filter or the like).

High-voltage rectangular pulses are for example required for the testing of insulating materials in solid, liquid or gaseous form. Very precise timing and/or amplitudes are required inter alia for driving electro-optical switches for lasers or the like, for pulsed spark and ionization chambers and for testing of electronic components, modules and equipment. Another field of application, in which stringent requirements are placed on resistance to short-circuiting, and accuracy of pulse shape, i.e. edge steepness and amplitude characteristic, is less important, is electrostatic filtering of waste gases.

So-called Marx generators for instance are sufficiently well known as to not require special reference to the literature. High voltages can be achieved with these. On account of the energy storage unit discharging through the load or bleeder resistors however rectangular pulses of a longer duration cannot be achieved with them. The known cable pulsers according to Fletcher and Blümlein have a coaxial cable to be charged up and a discharge gap or a krytron as the switching device. Long pulses cannot be produced with these since the propagation time in the cable determines their top length. Pulses 25 ms in duration require a cable length of about 2.5 km. Moreover, the cable losses and the dispersion of the wave lead to drooping of the top of the pulse and a poor trailing edge. Pulse circuits with output transformers, on account of the limited core inductance and the consequential exponential decay of the top of the pulse and the negative undershoot of the trailing edge of the output voltage, are unsuitable when the demands are greater.

In spite of the advances in the development of semiconductor devices, transistors and thyristors cannot be considered for the switching device if high switching capacities, high disruptive strength and short switching times are required. Electron tubes as a result of low specific cathode current density are too slow. Large cathode surfaces lead to excessive capacitances of the tube electrodes.

SUMMARY OF THE INVENTION

It is, therefore, the object of the present invention to provide a generator for producing high-voltage rectangular pulses, whose electrical data lie within the following ranges:

Pulse amplitude: −1 kv, . . . −30 kv, . . . −60 kv
Pulse duration: 100 μs, . . . 100 ms, . . . >10 s
Edge steepness: approx. 1 ns, . . . >20 ns (rise time 10% to 90%)
Trigger jitter: ±1 ns
Pulse train frequency: up to several kHz
Output: short-circuit proof, impedance 50Ω.

The edges of the pulses are to be free from overshoot. All this can only be achieved with designs for which in addition to the above-mentioned characteristics of known generators and switching devices the physical phenomena arising also receive the attention due.

To attain this object the present invention provides a generator for producing high-voltage rectangular pulses with devices for conversion of input power supplied from a DC source into pulses of output power using capacitive storage units, said pulse generator comprising a gas-filled pulser tube having a base at one end and a pulser head for the connection of a coaxial cable leading to a load, at the opposite end, and essentially coaxially arranged pulse circuit elements arranged in a compact manner in the pulser tube and matched in terms of impedance to the coaxial cable, viz: a capacitive storage unit, of the pulse circuit as a jacket element of the pulser tube; a terminating resistor for the coaxial cable to be connected as an inner body of the pulser tube; two electrodes of the gas-filled tube on the base of the pulser tube and on one end face of the inner body, respectively, and the pulser head on the opposite end of the pulser tube, said pulser tube having an envelope which changes into an outer conductor, whereas the inner body changes into an inner conductor of the pulser head.

With discharge gaps, in particular high-pressure discharge gaps, the switching capacities and switching times can also be achieved. When extreme requirements are placed on the trigger jitter however their values are not as good. Moreover, electrode consumption has to be taken into account.

It is important that the development according to the invention takes the electrical processes into account and controls them by means of design measures. This is made clear by the following short description of its operation:

From the moment of switching on, the charge exchange between the jacket element, as the charged capacitive storage unit, and the inner body takes place along stellate paths. Counterbalancing fields are induced. The voltage discontinuity arising at the terminating resistor of the cable propagates through the coaxial cable to the load capacitance connected. The reflected wave is absorbed by the terminating resistor of the cable. The pulse can be ended after the double propagation time through the cable and the de-ionization time of the switch-on gap at the earliest by a triggered switch off gap. The pulse shape, i.e. the leading and trailing edges, depends on the design and the impedance matching of the circuit elements. The load capacitance plus capacitance of the coaxial cable must be small relative to that of the capacitive storage unit.

The minimum length of the coaxial cable is given by the following:

$$L_K = \frac{c}{\sqrt{\epsilon_r}} \sqrt{t_{rs}^2 + (2.2 \times Z_K \times C_L)^2}$$

where
$L_k$ = cable length in m
$c$ = speed of light = $0.3 \times 10^9$ m/s
$t_{rs}$ = inherent rise time of the generator between 10% and 90% of the pulse height
$Z_K$ = characteristic impedance of the cable = 50Ω
$C_L$ = capacitance of the load in F.

In applications where precise amplitudes are required for the high-voltage rectangular pulses produced the load time constant must moreover be very large relative to the de-ionization time of the switch-on gap, viz:

$$R_v \times C_{sp} > > t_E$$

where $R_v$ = load resistance in Ω

$C_{sp}$ = capacitance of the storage unit in F $t_E$ = de-ionization time in s.

In a preferred embodiment of the invention a jacket element assembled like a basket from parallel rod capacitors may be provided for the capacitive storage unit. Such an arrangement on the one hand exhibits particularly small lead inductances and on the other hand has design and operational advantages. The number and size of the rod capacitors can easily be varied for different applications. Moreover, air can circulate around them contributing significantly to the cooling. In many cases cooling by means of such a basket and a blower allocated to it is sufficient.

With a different, alternative embodiment of the invention a jacket element designed like a double tube may be provided for the capacitive storage unit and equipped with capacitor coatings on the outside surface of the envelope of the pulser tube as well as on the inside surface of a collar fitted to the base of the pulser tube. This design also has particularly favorable lead inductances. Moreover, subsequent interference and alterations are practically impossible or only possible for experienced specialists so that the characteristics envisaged are guaranteed as far as possible.

It is helpful and makes sense to provide cooling fins for such embodiment of the invention on the collar of the base and/or on the envelope. If cooling fins are present on both parts it must be ensured that no unwanted fields develop between the edges of the cooling fins, which are at different potentials. This can be achieved for instance by offsetting fins provided on the collar of the base and on the envelope jacket relative to one another. The edges can also be chamfered or insulated from one another.

The coaxial arrangement and the design of the inner body is of considerable significance for all embodiments of the invention. The terminating resistor integrated into the inner body must maintain its resistance value exactly and is only accessible with difficulty. Assembly of the terminating resistor from ceramic component resistors on a tension rod is therefore particularly advantageous. In this way the requirements relating both to the shaping of the inner body and also to the value of the terminating resistor can be met. The ceramic component resistors are to be secured to the tension rod by suitable means, e.g. Belleville spring washers, pressure plates etc.

In this connection there is a particularly advantageous development of this embodiment of the invention in which pieces of indium foil are provided between the ceramic component resistors to act as their contacts. Such pieces of foil, about 0.1 mm in thickness, are commercially available and are particularly well proven for this purpose.

A further significant problem is the characteristic impedance matching, again inasmuch as discontinuities are to be avoided. To achieve this a form of the invention has been conceived in which the pulser tube envelope is finished in the shape of an exponential horn in the region of the terminating resistor. This exponential horn shape extends inside the pulser tube essentially between support insulators on both ends of the terminating resistor and the parts of the inner body connected to this and increases steadily in diameter towards the pulser head.

To produce very steep leading edges it is advantageous to provide a triggered discharge gap as a means for switching in a pulse. The charge exchange thereby initiated is immediately transferred to the electrodes of the actual gas-filled tube so that the full switching capacity does not have to be accepted by the triggered switching discharge gap itself and trigger jitter and electrode consumption can be kept to a negligible order of magnitude.

As has already been mentioned at the outset, these days thyristors or semiconductor circuits whose technology is derived from them are widely used. When however very high currents arise and pulses with very steep edges are to be switched, thyratrons continue to hold their place as trustworthy representatives of tube electronics. A thyratron is therefore envisaged as the gas-filled pulser tube in the preferred form of the invention, particularly for precision applications. Such a device with the essential features or all the features mentioned above is not yet commercially available. This of course is not to say that recourse cannot be made to this or that commercially available individual part for a special product of this sort. This is particularly important with regard to cheaper forms that are nevertheless suitable for applications placing less stringent requirements on the high-voltage rectangular pulses to be produced.

It is often desirable to be able to vary the pulse duration. This means that measures are required to end a pulse in a controlled manner. Embodiments of the invention envisaging a triggered discharge gap for switching off a pulse are suitable for this. In this manner the trailing edges of the pulses can of course also be influenced, and in particular high edge steepnesses achieved.

Filling the pulser tube with shielding gas is to be regarded as a helpful measure and is of significance with regard to both insulation and the cooling required. Preferred embodiments of the invention therefore have a space filled with shielding gas extending along the entire length of the pulser tube. For this purpose gas channels are to be provided if required in the support insulators holding the inner body and holes through the material of the exponential horn-shaped envelope. The space filled with shielding gas can extend into the pulser head if a gas-tight and/or fixed connection is provided for the coaxial cable.

For removable connections between pulser head and coaxial cable however a further significant problem arises with regard to measures aimed at achieving a seal. Generally speaking, materials and components suitable for sealing are poor electrical conductors. Transition resistances for the high-voltage rectangular pulses produced must however be avoided without fail. For some embodiments of the invention, plug couplings are possible, which are characterized by at least one annular groove with an inserted helical spring per contact position for a removable, gas-tight connection between pulser head and coaxial cable. Suitable helical springs consist of bronze or beryllium-bronze wire about 0.3 mm in diameter. The groove into which such a helix is inserted is to be dimensioned in each case so that the dimensions in the direction of pressure are smaller than those normal to it. The individual helices are thereby given an approximately elliptical section when the coupling parts are assembled or screwed together, forming a large number of contact positions with good electrical conductivity.

Moreover the embodiments of the invention can and should be provided with screening against X-rays, all the measures for which are familiar to a specialist active in this field so that they need no further explanation.

Important fields of application for high-voltage rectangular pulses with high precision and variable electrical data are e.g. mensuration and testing and scientific and engineering research and development. The loads to be considered for connection via a coaxial cable to a pulse generator in accordance with the embodiments of the invention are mainly capacitive, i.e. actual capacitors, but also antennae, particularly logarithmically periodic antennae. With the help of capacitive loads, for instance properties of gases such as charge carrier drift or the conductivity, the disruptive strength of insulating materials or electronic switching and circuit elements and components can be tested or determined. Antennae with a marked directional characteristic and a wideband spectrum, by means of which the pulse line available is radiated to the maximum extent possible, find application in irradiation strength tests (EMC—electromagnetic compatibility), during which equipment or components are subjected to extreme conditions. The power in the megawatt range supplied by the pulse generator can be amplified by a factor of about 10 by a suitably designed antenna. An edge steepness of 1 ns here corresponds to a bandwidth of about 350 MHz. Apart from the high-frequency characteristics, high-voltage aspects such as corona effect, sparking distance etc. are to be taken into account in the development and design of such antennae, so that an "interference" spectrum can be radiated in the form of an electromagnetic wave.

BRIEF DESCRIPTION OF THE DRAWING

Some embodiments of the invention will now be described by way of example and with reference to the accompanying schematic drawing in which:

FIG. 1 is a longitudinal cross section of a gas-filled pulser tube;

FIG. 2 is a perspective view of a jacket element provided with rod capacitors arranged like a basket;

FIG. 3 is a fragmentary longitudinal cross section of a jacket element with coaxially assembled envelope and collar;

FIG. 4 is a fragmentary perspective view of a terminating resistor assembled from component resistors;

FIG. 5 is a fragmentary longitudinal section showing a removable, gas-tight connection for securing a coaxial cable to the pulser head;

FIG. 6 is a basic pulse circuit diagram, and

FIG. 7 is a time trace for the triggered switching on and off of a high-voltage rectangular pulse.

DESCRIPTION OF THE PREFERRED EMBODIMENTS

FIG. 1 shows a gas-filled pulser tube 1 which comprises the following individual parts: a base 5 with an electrode K (cathode) as well as one of the electrodes of a triggered switching discharge gap $S_1$. A trigger pulse generator $P_1$ connected via a pulse transformer belongs to this. Between the base 5 and the envelope 8 of the pulser tube 1 a jacket element 3 is envisaged, which comprises a capacitive storage unit $C_{sp}$ required for the pulse circuit. The capacitive storage unit $C_{sp}$ is charged by a DC source U through a dropping resistor $R_v$. Special forms of the jacket element 3 are represented in FIGS. 2 and 3 and are explained in greater detail below.

The pulser tube 1 is developed as a thyratron 20 in this part, with the coaxial design being of considerable importance. The counter electrode A (anode) of the pulser tube 1 is on one of the end faces 6 of an inner body 4, which is held in turn both radially and axially in the envelope 8 by means of support insulators at both ends. A second switching discharge gap $S_2$ is formed by two electrodes, one on the envelope 8, the other at electrode A of the gas-filled pulser tube 1, and is also connected via a transformer to an associated trigger pulse generator $P_2$.

A terminating resistor R forms a significant part of the inner body 4. It is assembled from ceramic component resistors 17, as represented in greater detail in FIG. 4. The outer wall of the inner space is formed by the envelope 8, which is developed as an exponential horn shape whose diameter increases steadily towards the pulser head 7. Holes in the support insulators and in the material of the exponential horn shape provide for adequate circulation of gas.

The envelope 8 changes into the outer conductor 9 of the pulser head 7, the inner body 4 into the inner conductor 10 of the pulser head 7. The pulser head 7 thereby forms the transition between the pulser tube 1 and a coaxial cable 2 to be connected and serves to match up the different dimensions on each side without unwanted effects on the operation of the generator. The coaxial cable 2 leads to a capacitive load $C_L$ which is not represented as such here.

In the jacket element $3^1$ represented in FIG. 2 the capacitive storage unit $C_{sp}$ is formed of parallel rod capacitors 11 arranged like a basket. Their fixings at the two ends are not represented and can be executed as seen fit by a specialist. A symmetrical design and if possible an air gap between a rod capacitor 11 and the outside surface of the cylindrical jacket element $3^1$ to ensure effective cooling are however important.

In the form of a jacket element $3^2$ represented in FIG. 3 the base $5^1$ is provided with a collar 15 which is coaxial and taken over the envelope 8. The capacitor surfaces forming the capacitive storage unit $C_{sp}$ are provided accordingly on the outside surface 12 of the envelope 8 and on the inside surface 14 of the collar 15. The gap between the surfaces 12 and 14 is filled with a suitable dielectric. Cooling fins 16 are represented on the collar 15 and also on the envelope 8. Since the two parts carrying the cooling fins 16 have different potentials, the formation of unwanted fields between the latter must be prevented, e.g. by shaping the edges of the cooling fins 16, preferably by chamfering them. Each of the cooling fins 16 can also be positioned in a gap.

The design represented in FIG. 4 of a terminating resistor R of the ceramic component resistors 17 does not reproduce all the details. Thus the representation leaves over nuts, pressure discs, spring washers etc. The component resistors 17 are threaded onto a tension rod 18, on which also the electrode A is secured to the end face 6 (see FIG. 1) and the inner conductor 10 of the pulser head 7 to the opposite end face. Pieces of indium foil 19 provide outstandingly good contact between the individual component resistors 17.

In the embodiment represented in FIG. 5 for a removable, gas-tight connection of the coaxial cable 2 to the pulser head 7, details of less importance for the purposes of the invention have been omitted for the sake of clarity. The outer conductor 9 of the pulser head 7 is constructed as a coupling part 21, i.e. initially for instance provided with a male screw thread. A land is turned for sealing with an 'O' ring 28. Moreover, in the end face at least one groove 24 is provided whose width (in the radial direction) is greater than its depth (in the axial direction). A helical spring 25 is inserted into this groove 24 so as to be compressed to some extent when closing up so that each of its turns has four contact points.

Finally, also not represented is a connection for filling a space 13 (FIG. 1) of the pulser tube 1 with shielding gas. This space 13 extends along the entire length of the pulser tube.

The mating piece for the connection, a coupling part 22, is essentially formed by two pressure discs 26 and 27 which are connected to each other by screws or the like and consist of a material with good conductivity, e.g. brass, between which the outer conductor of the coaxial cable 2, flared on the outside, is squeezed. The coupling parts 21 and 22 are drawn together with a union nut 23, whereby for instance a further ring element made of a suitable plastic should be provided between the pressure disc 26 and the union nut 23 to serve particularly as antifriction disc but also as guide element.

The operation of a high-voltage rectangular pulse generator can be discerned from its basic circuit diagram shown in FIG. 6. The capacitive storage unit $C_{sp}$ is supplied by the DC voltage source via the dropping resistor $R_v$. By means of a trigger pulse (see also FIG. 7) output by a trigger pulse generator $P_1$, the switching discharge gap $S_1$ is closed and the charge of the capacitive storage unit $C_{sp}$ jumps through the resistor R and the coaxial cable to the capacitive load $C_L$. The resistance R equals the characteristic impedance Z of the coaxial cable. The voltage at the capacitive load $U_{CL}$ remains until the trigger pulse generator $P_2$ (see also FIG. 7) closes the switching discharge gap $S_2$ and short-circuits the specimen ($C_L$). The switching discharges in gaps $S_1$ and $S_2$ extinguish and open the current path concerned as soon as the voltage has dropped correspondingly. They can be struck again after the de-ionization period.

The circuit inductance essentially depends on the loop of the pulse voltage circuit and the self-inductance of the generator. To keep the difficulties arising from this within bounds a compact design is advisable in any case. Coaxial design moreover provides compensation of inductances of important current paths as a result of the symmetries.

The invention may be embodied in other specific forms without departing from the spirit or essential characteristics thereof. The embodiments are therefore to be considered in all respects as illustrative and not restrictive.

What is claimed is:

1. A pulse generator for converting input power supplied from a DC source into rectangular high voltage pulses of output power to a coaxial cable, comprising inner and outer conductors, leading to a load, said generator comprising a gas-filled tube comprising:
   (a) an inner cylindrical body comprising series resistor elements from one end to the other to form a resistor, said inner cylindrical body having a first electrically conductive electrode at said one end and an inner conductor at said other end;
   (b) an annular outer gas-filled envelope coaxial with and spaced from said inner body, said annular envelope having a base end at one end thereof spaced from said one end of said inner body and an annular outer conductor at the other end thereof surrounding said inner conductor at said other end of said inner body, said base end of said outer envelope including a second electrically conductive electrode spaced from said first electrode at said one end of said inner body;
   (c) means for switching on a pulse comprising a first triggered switching discharge gap; and
   (d) means for switching off a pulse comprising a second triggered switching discharge gap;
   (e) said inner conductor at said other end of said inner body being tapered and gradually merging to and being connected to said inner conductor of said coaxial cable and said annular outer conductor at said other end of said outer envelope being tapered and gradually merging to and being connected to said outer conductor of said coaxial cable.

2. A pulse generator according to claim 1 further comprising a capacitive storage unit assembled from parallel rod capacitors surrounding and being connected to said base.

3. A pulse generator according to claim 1 wherein a collar over said base surrounds said envelope to form with said envelope a storage capacitor for said generator.

4. A pulse generator according to claim 3 wherein cooling fins are provided on said collar of said base.

5. A pulse generator according to claim 3 wherein cooling fins are provided on said envelope.

6. A pulse generator according to claim 3 wherein cooling fins are provided on said base and on said envelope.

7. A pulse generator according to claim 1 wherein said resistor is assembled from ceramic component resistors mounted on a tension rod.

8. A pulse generator according to claim 7 wherein pieces of indium foil are provided between said ceramic component resistors to act as electrical contacts.

9. A pulse generator according to claim 1 wherein the interior surface of said envelope is in the shape of an exponential horn.

10. A pulse generator according to claim 1 wherein a thyratron is provided as a gas-filled pulser tube.

11. A pulse generator according to claim 1 wherein a space filled with gas extends along the entire length of said tube.

12. A pulse generator according to claim 1 characterized by at least one annular groove with an inserted helical spring per contact position for a removable, gas-tight connection between said generator and said coaxial cable.

13. A pulse generator for converting input power supplied from a DC source into rectangular high voltage pulses of output power to a coaxial cable, comprising inner and outer conductors, leading to a load, said generator comprising a gas-filled tube comprising:
   (a) an inner cylindrical body comprising series resistor elements from one end to the other to form a resistor, said inner cylindrical body having a first electrically conductive electrode at said one end and an inner conductor at said other end;
   (b) an annular outer gas-filled envelope coaxial with and spaced from said inner body, said annular envelope having a base end at one end thereof spaced from said one end of said inner body and an annular outer conductor at the other end thereof surrounding said inner conductor at said other end of said inner body, said base end of said outer envelope including a second electrically conductive electrode spaced from said first electrode at said one end of said inner body;

(c) a collar over said base surrounding said envelope to form with said envelope a storage capcitor, and cooling fins mounted on said collar;

(d) said inner conductor at said other end of said inner body being tapered and gradually merging to and being connected to said inner conductor of said coaxial cable and said annular outer conductor at said other end of said outer envelope being tapered and gradually merging to and being connected to said outer conductor of said coaxial cable.

14. A pulse generator for converting input power supplied from a DC source into rectangular high voltage pulses of output power to a coaxial cable, comprising inner and outer conductors, leading to a load, said generator comprising a gas-filled tube comprising:

(a) an inner cylindrical body comprising series resistor elements from one end to the other to form a resistor, said inner cylindrical body having a first electrically conductive electrode at said one end and an inner conductor at said other end;

(b) an annular outer gas-filled envelope coaxial with and spaced from said inner body, said annular envelope having a base end at one end thereof spaced from said one end of said inner body and an annular outer conductor at the other end thereof surrounding said inner conductor at said other end of said inner body, said base end of said outer envelope including a second electrically conductive electrode spaced from said first electrode at said one end of said inner body;

(c) a collar over said base surrounding said envelope to form with said envelope a storage capacitor, and cooling fins mounted on said envelope;

(d) said inner conductor at said other end of said inner body being tapered and gradually merging to and being connected to said inner conductor of said coaxial cable and said annular outer conductor at said other end of said outer envelope being tapered and gradually merging to and being connected to said outer conductor of said coaxial cable.

15. A pulse generator for converting input power supplied from a DC source into rectangular high voltage pulses of output power to a coaxial cable, comprising inner and outer conductors, leading to a load, said generator comprising a gas-filled tube comprising:

(a) an inner cylindrical body comprising series resistor elements from one end to the other to form a resistor, said inner cylindrical body having a first electrically conductive electrode at said one end and an inner conductor at said other end;

(b) an annular outer gas-filled envelope coaxial with and spaced from said inner body, said annular envelope having a base end at one end thereof spaced from said one end of said inner body and an annular outer conductor at the other end thereof surrounding said inner conductor at said other end of said inner body, said base end of said outer envelope including a second electrically conductive electrode spaced from said first electrode at said one end of said inner body;

(c) a collar over said base surrounding said envelope to form with said envelope a storage capacitor, and cooling fins mounted on said base and said envelope;

(d) said inner conductor at said other end of said inner body being tapered and gradually merging to and being connected to said inner conductor of said coaxial cable and said annular outer conductor at said other end of said outer envelope being tapered and gradually merging to and being connected to said outer conductor of said coaxial cable.

16. A pulse generator for converting input power supplied from a DC source into rectangular high voltage pulses of output power to a coaxial cable, comprising inner and outer conductors, leading to a load, said generator comprising a gas-filled tube comprising:

(a) an inner cylindrical body comprising series resistor elements from one end to the other to form a resistor, said resistor comprising ceramic component resistors mounted on a tension rod, pieces of indium foil being positioned between said ceramic component resistors to act as electrical contacts, said inner cylindrical body having a first electrically conductive electrode at said one end and an inner conductor at said other end;

(b) an annular outer gas-filled envelope coaxial with and spaced from said inner body, said annular envelope having a base end at one end thereof spaced from said one end of said inner body and an annular outer conductor at the other end thereof surrounding said inner conductor at said other end of said inner body, said base end of said outer envelope including a second electrically conductive electrode spaced from said first electrode at said one end of said inner body;

(c) said inner conductor at said other end of said inner body being tapered and gradually merging to and being connected to said inner conductor of said coaxial cable and said annular outer conductor at said other end of said outer envelope being tapered and gradually merging to and being connected to said outer conductor of said coaxial cable.

17. A pulse generator for converting input power supplied from a DC source into rectangular high voltage pulses of output power to a coaxial cable, comprising inner and outer conductors, leading to a load, said generator comprising a gas-filled tube comprising:

(a) an inner cylindrical body comprising series resistor elements from one end to the other to form a resistor, said inner cylindrical body having a first electrically conductive electrode at said one end and an inner conductor at said other end;

(b) an annular outer gas-filled envelope coaxial with and spaced from said inner body, said annular envelope having a base end at one end thereof spaced from said one end of said inner body and an annular outer conductor at the other end thereof surrounding said inner conductor at said other end of said inner body, said base end of said outer envelope including a second electrically conductive electrode spaced from said first electrode at said one end of said inner body; and (c) at least one annular groove with an inserted helical spring per contact position for a removable, gas-tight connection between said generator and said coaxial cable;

(e) said inner conductor at said other end of said inner body being tapered and gradually merging to and being connected to said inner conductor of said coaxial cable and said annular outer conductor at said other end of said outer envelope being tapered and gradually merging to and being connected to said outer conductor of said coaxial cable.

* * * * *